Figure 1:
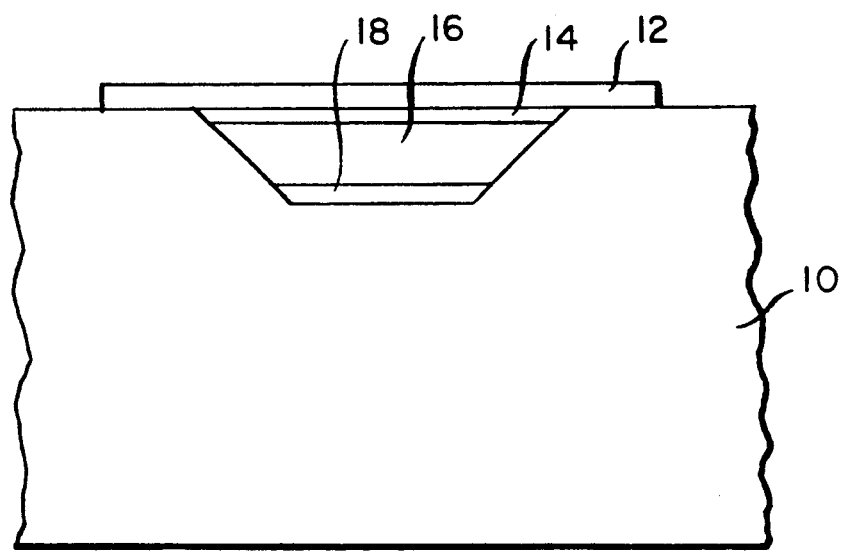

United States Patent
Zeto et al.

[11] Patent Number: 5,163,220
[45] Date of Patent: Nov. 17, 1992

[54] METHOD OF ENHANCING THE ELECTRICAL CONDUCTIVITY OF INDIUM-TIN-OXIDE ELECTRODE STRIPES

[75] Inventors: Robert J. Zeto, Eatontown, N.J.; Otto J. Gregory, Wakefield, R.I.; Richard C. Piekarz, Ocean Grove, N.J.

[73] Assignee: The Unites States of America as represented by the Secretary of the Army, Washington, D.C.

[21] Appl. No.: 773,814

[22] Filed: Oct. 9, 1991

[51] Int. Cl.$^5$ ............................................. H05K 3/02
[52] U.S. Cl. ............................... 29/846; 359/58; 359/70; 428/555; 430/313; 430/314
[58] Field of Search ............................ 359/58, 70, 71; 430/313, 314, 20; 428/555; 29/846

[56] References Cited

U.S. PATENT DOCUMENTS

| 4,670,097 | 6/1987 | Abdalla et al. | 156/659.1 |
| 4,859,036 | 8/1989 | Yamanaka et al. | 359/58 |

FOREIGN PATENT DOCUMENTS

| 58-178320 | 10/1983 | Japan | 359/58 |
| 59-9635 | 1/1984 | Japan | 359/58 |
| 60-161686 | 8/1985 | Japan | 430/20 |

OTHER PUBLICATIONS

J. Electrochem. Soc. 138(7), 2070-5 (Eng) 1991 by O. J. Gregory et al.

*Primary Examiner*—Carl J. Arbes
*Attorney, Agent, or Firm*—Michael Zelenka; Roy E. Gordon

[57] ABSTRACT

A method is provided of enhancing the electrical conductivity of indium-tin-oxide electrode stripes in thin film electroluminescent display panels by using an electronic grade glass substrate for the thin film electroluminescent display panels and by the incorporation of a narrow and thick metal bus bar of high electrical conductivity trenched into and coplanar with the surface of the glass substrate and in electrical continuity with the indium-tin-oxide electrode.

5 Claims, 1 Drawing Sheet

METHOD OF ENHANCING THE ELECTRICAL CONDUCTIVITY OF INDIUM-TIN-OXIDE ELECTRODE STRIPES

GOVERNMENT INTEREST

The invention described herein may be manufactured, used, and licensed by or for the Government for governmental purposes without the payment to us of any royalty thereon.

FIELD OF INVENTION

This invention relates to a method of improving display panels used in display technology, and in particular to a method of enhancing the electrical conductivity of indium-tin-oxide (ITO) electrode stripes in thin film electroluminescent (TFEL) display panels, thereby improving the performance characteristics of these panels and making possible the fabrication of large area panels.

BACKGROUND OF THE INVENTION

Present practice in TFEL panel manufacture comprises the use of ITO, as-deposited and patterned on a glass substrate, as the transparent electrode. The ITO thickness is typically limited to about 0.3 micron due to various problems such as panel breakdown that occurs at the edges of thicker ITO stripes. The electrical conductivity of this ITO material is sufficiently low as to impose limitations on the performance characteristics of TFEL display panels, particularly large area display panels with long ITO electrode stripes.

SUMMARY OF THE INVENTION

The general object of this invention is to provide a method of enhancing the electrical conductivity of transparent electrode stripes in TFEL display panels. A more specific object of the invention is to provide a method of enhancing the electrical conductivity of the ITO electrode stripes in TFEL panels using electronic grade glass substrate for the TFEL display panels to improve the performance characteristics of these panels and make possible the fabrication of large area panels.

It has now been found that the aforementioned objects can be attained by incorporation of a narrow and thick metal bus bar of high electrical conductivity trenched into and coplanar with the surface of the glass substrate and in electrical contact with the ITO electrode.

The uses of the invention are all for applications requiring the visual display of information. A specific application is the enhancement of the electrical conductivity of the ITO transparent electrode stripes used in conventional TFEL display panels. Other possible applications include the fabrication of any device constructed on a glass substrate wherein it is desirable and advantageous to recess any feature of that device into the glass substrate in a specific patterned geometry using wet chemical etching of the glass. Applications pertain both to the military and commercial sectors, particularly for the visual display of information.

The problem solved in the manufacture of TFEL display panels is the undesirably low electrical conductivity of the transparent ITO electrode material. In conventional TFEL panels, the low electrical conductivity of ITO adversely affects all of the following performance characteristics: brightness, brightness uniformity, speed, frequency, and power consumption. These characteristics are critically diminished for large area TFEL display panels with long ITO electrode stripes. In the present invention, the electrical conductivity of ITO is enhanced by the incorporation of a narrow and thick metal bus bar of high electrical conductivity trenched into and coplanar with the surface of the glass substrate and in electrical continuity with the ITO electrodes. This method alleviates or solves all of the above problems of conventional and large area TFEL panels.

A critical problem solved to implement the inventive method is the formation of a specific and predetermined pattern of chemically etched trenches having controlled sidewall angles as large as 45 degrees in a commercial glass substrate. Selective etching of a trench pattern on a substrate utilizes an etch mask on the substrate surface that is exposed only in the areas to be etched. Wet chemical etching of a pattern in commercially available glass plate substrates in the as-received condition produces extremely shallow trench sidewall angles with a poorly defined trench and an unacceptably wide trench opening. This is evidenced by a Corning 7059 electronic grade glass substrate used for TFEL display panels. The ratio of lateral to vertical etching is about 12:1 (less than 5 degrees). This highly anisotropic etching behavior prevents the fabrication of reproducible trenches with narrow openings at the surface of the glass substrate. Subsequent deposition of materials in the trenches is therefore subject to poor and limited linewidth control. It is expected that the glass, due to its non-crystalline structure, would exhibit isotropic etch rate behavior, i.e. equal distances etched laterally and vertically with a 45 degree trench sidewall angle. That the expected etch behavior is not observed is possibly the reason why there is no precedent for the formation of wet chemically trenched structures in commercial glass plate substrates. By subjecting the glass substrate to a special optimized heat treatment procedure, the invention described herein overcomes the highly anisotropic etch rate behavior to achieve wet chemically trenched patterns with sidewall angles as large as 45 degrees and a lateral to vertical etch ratio of 1:1.

This invention achieves enhancement of the electrical conductivity of the ITO transparent electrode. This is accomplished by fabricating deep, narrow metal bus lines of high electrical conductivity underneath and contiguous with ITO. This structure augments the ITO line conductivity. For all panels, but particularly for large area panels, the inventive method therefore will have a beneficial effect on the TFEL characteristics of speed, brightness, brightness uniformity, frequency, and power consumption.

A most important advantage of the inventive method is that its implementation specifically utilizes wet chemical etching to form the trenches in the glass substrate for the metal bus lines. Dry etch methods require etching equipment that is very expensive and that has a limited size of the process chamber that in turn limits the size of the substrate that can be etched. On the other hand, large chemical baths are commercially available to etch glass substrates, and therefore this method is inexpensive and attractive as a manufacturing process.

It is also an advantage of the present invention that it maintains the conventional ITO thickness and surface topography over the edges of the electrode stripes. Thus conventional TFEL manufacturing processes are retained subsequent to the modification of the glass substrate with the recessed metal bus lines.

An additional advantage of the present invention is that it simplifies the fabrication of the ITO electrode. In the prior art, special annealing steps are critically required to maximize the electrical conductivity of as-deposited ITO. In the inventive method the electrical conductivity of the underlying metal bus lines is sufficiently greater than that of the ITO so as to dominate the electrical conductivity of the ITO/bus composite electrode, thereby simplifying and reducing the criticality of the special processing needed for ITO when employed alone. The metal bus line provides greater and desirable process latitude for reproducible and satisfactory fabrication of the transparent electrode.

DESCRIPTION OF THE DRAWING AND THE PREFERRED EMBODIMENT

FIG. 1 is a cross sectional view of a structure resulting from application of the invention method. Referring to FIG. 1 of the drawing that is not drawn to scale, the glass substrate, 10, bears ITO transparent electrode stripes, 12. The stripes, 12, are in contact with an underlying narrow metal bus line consisting of a barrier metal, 14, a bus metal, 16, and an adhesive metal, 18, trenched in the glass substrate, 10, as indicated.

In the preferred embodiment, a sheet resistance of 0.1 ohm/sq. results for the transparent electrode. Commercially available Corning 7059 electronic grade glass is used as the substrate, 10, the trenches have 45 degree sidewalls with a base width of about 40 microns and a depth of about 1,000 nm, and the trench metals are centered under the ITO electrode stripes, 12. Other transparent glass substrates are also suitable. The trench sidewall angle is chosen at its maximum value of 45 degrees in order to minimize the trench openings at the surface of the glass substrate, 10. The width and depth of the trenches are design features that determine the magnitude of the electrical conductivity for a specific bus metal, 16. These values of the trench dimensions are about 40 microns and 1,000 nm, respectively. The width of the trenches is limited to about 40 microns for conventional TFEL displays since this magnitude cannot be discerned by the human eye and the thick trench metal structure is opaque. Smaller trench widths may be desirable for smaller pixel sizes and are amenable to fabrication. The depth of the trenches is essentially unlimited, but will typically be less than 1,000 nm for TFEL display panels. The trench metal may be positioned asymmetrically under the ITO stripes.

The structure shown in FIG. 1 for Corning 7059 electronic grade glass is obtained by the following steps.

(A) The surface of the as-received glass plate substrate is cleaned using standard cleaning solvents and procedures.

(B) The glass plate substrate is heated in an oven in air at 650 degrees centigrade for 1 hour. These conditions are found to be optimum for the fabrication of trenches with maximum sidewall angles of 45 degrees.

During this step, a sacrificial glass plate is placed upon the substrate to prevent it from cracking due to thermal stresses that arise after removal from the oven. It is this heat treatment step of the invention method that determines the subsequent etch rate of the glass plate substrate and the sidewall angle of the etched trench. Heat treatment temperatures lower than 650 degrees centigrade result in smaller sidewall angles. Heat treatment temperatures higher than 650 degrees centigrade result in non-smooth trench surface topography due to the formation of unwanted crystallites in the glass.

Wet chemical etch rate studies of as-received Corning 7059 glass reveal that the etch rates are dependent on the depth of glass etched. Commercial glass plates are typically fabricated by a rolling process that produces residual compressive stresses in the surface layers of the glass. The etching behavior is attributed to these residual stresses that inhibit the wet chemical etch rate and cause anisotropic wet etching behavior. Heat treatments for 1 hour at annealing temperatures between 300 and 700 degrees centigrade in air are investigated to relieve these residual stresses. It is found that increased annealing temperatures increase the sidewall angle of the trench. At temperatures greater than 650 degrees centigrade, however, some phase separation in this barium borosilicate glass occurs. Crystallites are observed in the glass after etching, that can be attributed to either a phase separation/crystallization of a barium oxide rich phase or an acid induced crystallization process within the glass itself. In either case, these crystallites could have an adverse effect on the topography of the trench. Excessive temperatures are also conducive to warpage of the glass plate which should be avoided. Thus for Corning 7059 glass which has an annealing temperature of 630 degrees centigrade and a strain point of 593 degrees centigrade, the heat treatment conditions specified above are optimal to attain isotropic etching without warpage and phase separation in the glass. Similar behavior but different heat treatment conditions may be expected for other commercial glasses which will have different annealing and strain point temperatures.

(C) Organic photoresist material is spun onto the surface of the glass and a photomask is used to selectively develop the photoresist and expose the surface of the glass plate substrate in the desired pattern to be trenched.

This step is accomplished by standard photolithographic methods. The remaining photoresist serves as a mask for the wet chemical etching of the substrate. The photoresist must be chemically stable in buffered hydrofloric acid (HF) ammonium fluoride ($NH_4F$) solution that are typically employed to etch commercial glass plate substrates.

(D) The exposed glass is etched for about 10 minutes in an etching solution composed of 1 part hydrofloric acid and 8 parts ammonium fluoride to give trenches about 1,000 nm deep with 45 degree sidewalls.

During etching the glass is etched vertically and also horizontally underneath the photoresist mask. The heat treatment temperature utilized in step B governs the sidewall angle of the trench and the etch rate of the glass substrate. For Corning 7059 glass heat treated at 650 degrees centigrade for 1 hour in air, an etching solution of 1:8 (HF:NH F) produces etch rates of about 100 nm/min and the trench sidewall angles of 45 degrees shown in FIG. 1. Buffered HF solutions ranging in composition rom 1:2 to 1:10 (HF:$NH_4F$) are used to produce trenches in Corning 7059 glass. This range of compositions is probably suitable for most commercial glasses, although other compositions may be required. For a specific type of glass and etching solution, the depth of the trench and the opening of the trench are determined by the etch time and the sidewall angle imposed by the heat treatment temperature previously employed.

After the completion of step D, the trench may be filled with any desired material such as a metal, insulator, semiconductor, or superconductor.

(E) A layer of titanium, 18, about 100 nm thick, is deposited in the trench using an rf sputtering technique.

This film serves to provide adhesion of the bus metal, 16, to the surface of the glass in the trench. Other common adhesion promoting metals such as chromium and nickel are also suitable. Some metals such as aluminum may not require an adhesion promoting film.

(F) A layer of silver, 16, about 1,000 nm thick is then deposited in the trench using a rf sputtering technique.

This film is the bus metal and serves, with its high electrical conductivity, to substantially enhance the electrical conductivity of the ITO electrode, 12, deposited later. Other bus metals with high electrical conductivity such as aluminum, copper, gold, nickel, and chromium are also suitable.

(G) A layer of titanium, 14, about 100 nm thick is then deposited in the trench using an rf sputtering technique.

This film forms a diffusion barrier between the bus metal, 16, and the ITO stripes, 12, so that the metallization will survive any subsequent heat treatment steps needed to fabricate the TFEL panel, e.g. annealing of the phosphor(s). Thin film chemical interactions can degrade the properties of the ITO electrodes and the light-emitting phosphors in the TFE panel stack. Other common barrier metals such as nickel, tungsten, titanium nitride, and chromium are also suitable.

(H) The photoresist film, deposited in step C is dissolved in a solvent such as acetone to lift-off the excess metal thereby leaving behind the metals in the trenches.

(I) A standard photolithography process is used to prepare, on the glass substrate, a photoresist film with 200 micron wide stripe openings centered over the trench metal.

The stripe openings govern the subsequent width of the ITO electrodes and may be any width desired. The stripe openings in the photoresist film are positioned relative to the trench metal by means of alignment keys incorporated in the respective photomasks. The stripe openings and their location over the trench metal are design features that are easily controlled and implemented to fabricate symmetrical or asymmetrical trench metal lines under the ITO stripes.

(J) A layer of ITO, 12, about 150 nm thick is then deposited by an rf sputtering technique.

This ITO thickness is typically employed for the reliable fabrication of conventional TFEL panels, although other values are also suitable.

(K) The photoresist film applied in step I is dissolved in a solvent such as acetone to lift-off the excess metal thereby leaving behind the patterned ITO stripes, 12, over the trench metal structure and the glass substrate, 10.

(L) The glass substrate with patterned ITO stripes and trench metal structure, FIG. 1, is then conventionally heat-treated in vacuum at temperatures up to about 400 degrees centigrade to improve the electrical conductivity of the ITO.

Other modifications are seen as coming within the scope of the invention.

For example, where Corning 7059 glass is the substrate, heat treatment temperatures lower than 650° C. can be used to control the angle of the trench sidewall between 2 and 45 degrees. Then again, for Corning 7059 glass, any concentration of buffered HF etching solution can be used. Then too, other glass substrates than Corning 7059 can be used in the invention method. The glass substrate used should be formed by a method that produces residual stress within the glass. Where a glass substrate other than Corning 7059 is used, any annealing temperature below the softening point can be used. Moreover, for glass substrates other than Corning 7059, any concentration of buffered HF etching solution can be used.

As the etch mask material, one may use a photoresist material that is basically inert to buffered HF etching solutions.

One may use asymmetric submerged bus bar designs underneath the ITO electrode. Adhesion promoting metals such as chromium and nickel may be used. Bus metals with high electrical conductivity can be used including aluminum, copper, gold, chromium and nickel. Barrier metals such as nickel, tungsten, titanium nitride and chromium may be used. Also, various compositions of ITO and other transparent electrode materials can be used including zinc oxide and tin oxide.

In the method of the invention, the adhesion promoter film thicknesses can range from 0 to 500 nm. Bus metal thicknesses can range from 0 to 5 microns. Barrier metal thicknesses can range from 0 to 500 nm. Transparent electrode thicknesses can range from 0 to 2 microns.

Moreover, one can use metals, insulators, semiconductors, or superconductors to fill the chemically etched trench in a glass substrate.

We wish it to be understood that we do not desire to be limited to the exact details of construction shown and described for obvious modifications will occur to a person skilled in the art.

What is claimed is:

1. Method of enhancing the electrical conductivity of indium-tin-oxide (ITO) electrode stripes in thin film electroluminescent (TFEL) display panels, thereby improving the performance characteristics of these panels and making possible the fabrication of large area panels, said method comprising incorporating a narrow and thick metal bus bar of high electrical conductivity trenched into and coplanar with the surface of a glass substrate and in electrical contact with the ITO electrode.

2. Method of enhancing the electrical conductivity of ITO electrode stripes in TFEL display panels using electronic grade glass substrate for the TFEL display panels, said method including the steps of:

(A) cleaning the glass plate substrate using standard cleaning solvents and procedures, (B) heating the glass plate substrate in an oven in air at about 650 degrees centigrade for about 1 hour, (C) spinning organic photoresist material onto the surface of the glass and using a photomask to selectively develop the photoresist and expose the surface of the glass plate substrate in the desired pattern to be trenched, (D) etching the exposed glass for about 10 minutes in an etching solution composed of 1 part hydrofluoric acid and 8 parts ammonium fluoride to give trenches about 1,000 nm deep with 45 degree sidewalls, (E) depositing a layer of titanium about 100 nm thick in the trench using an rf sputtering technique, (F) depositing a layer of silver about 1,000 nm thick in the trench using an rf sputtering technique (G) depositing a layer of titanium about 100 nm thick in the trench using an rf sputtering technique, (H) dissolving the photoresist deposited in step (C) in a solvent such as acetone to lift-off the excess metal thereby leaving behind the metals in the trenches, (I) using a standard photolithographic process to prepare on the glass substrate, a photoresist film with about 200 micron wide stripe openings centered over the trench metal, (J) depositing a layer of ITO about 150 nm thick by an rf sputtering technique, (K) dissolving the photoresist film applied in step (I) in a solvent such as acetone to lift-off the excess metal thereby leaving behind the patterned ITO stripes over the trench metal structure and the glass substrate, and (L) heat treating the glass substrate with patterned ITO stripes and trench metal structure in vacuum at temperatures up to about 400° C. to improve the electrical conductivity of the ITO.

3. Method according to claim 2 wherein in step (B), a sacrificial glass plate is placed upon the substrate to prevent it from cracking due to thermal stresses that arise after removal from the oven.

4. Method according to claim 2 wherein in step (D), the heat treatment used governs the sidewall angle of the trench and the etch rate of the glass substrate.

5. Method according to claim 2 wherein after the completion of step D, the trench maybe filled with any desired material such as a metal, insulator, semiconductor, or superconductor.

* * * * *